US005321332A

United States Patent [19]

Toda

[11] Patent Number: 5,321,332

[45] Date of Patent: Jun. 14, 1994

[54] WIDEBAND ULTRASONIC TRANSDUCER

[75] Inventor: Minoru Toda, Lawrenceville, N.J.

[73] Assignee: The Whitaker Corporation, Wilmington, Del.

[21] Appl. No.: 975,467

[22] Filed: Nov. 12, 1992

[51] Int. Cl.[5] ........ H01L 41/08

[52] U.S. Cl. ........ 310/322; 310/334; 310/800; 310/332; 310/369

[58] Field of Search ........ 310/800, 322, 324, 366, 310/330-332, 369; 381/190; 367/164

[56] References Cited

U.S. PATENT DOCUMENTS

| | | | |
|---|---|---|---|
| 3,832,580 | 8/1974 | Yamamuro et al. | 310/800 X |
| 4,088,915 | 5/1978 | Kodama | 310/334 |
| 4,127,749 | 11/1978 | Atoji et al. | 310/800 X |
| 4,413,202 | 11/1983 | Krempl et al. | 310/800 X |
| 4,434,384 | 2/1984 | Dunnrowicz et al. | 310/325 |
| 4,578,613 | 3/1986 | de Boer et al. | 310/800 X |
| 4,604,542 | 8/1986 | Thompson | 310/334 |
| 4,633,119 | 12/1986 | Thompson | 310/325 |
| 4,672,591 | 6/1987 | Breimesser et al. | 367/152 |
| 4,835,747 | 5/1989 | Billet | 310/800 X |
| 4,916,675 | 4/1990 | Hoering | 367/153 |
| 4,918,666 | 4/1990 | Beauducel et al. | 310/800 X |
| 4,996,713 | 2/1991 | Bittencourt | 310/332 X |
| 5,185,549 | 2/1993 | Sullivan | 310/334 |

OTHER PUBLICATIONS

Dameron, D. H., Linvill, J. G., "Cylindrical $PVF_2$ Electromechanical Transducers", Sensors and Actuators, vol. 2, pp. 73-84 (1981/82).

Linvill, J. G., "Piezoelectric Polymer Transducer Arrays", Stanford University, IEEE Pub. No. CH2358-0/86/0000-0506 (1986).

Linvill, J. G., "$PVF_2$ Models, Measurements and Devices", Ferroelectrics, vol. 28, pp. 291-296 (1980).

*Primary Examiner*—Mark O. Budd

*Attorney, Agent, or Firm*—William B. Noll

[57] ABSTRACT

A wideband ultrasonic transducer comprises at least two stretched piezoelectric polymer films rolled together in a lengthwise direction so as to form a scroll having an axis parallel to a stretch direction of the polymer films. Each of the polymer films has a different width W in a longitudinal direction of the scroll, where the widths W are related to respective acoustic wavelengths λ of the polymer films. A resonant frequency of each polymer film is selected by varying the widths W of each polymer film and the resonant frequencies of the polymer films are preferably selected so as to occupy a desired contiguous frequency band. An electric field is applied to each of the polymer films in parallel so as to induce expansion or shrinkage of the polymer films in their stretched directions, thereby causing resonance at their respective resonant frequencies. In one embodiment, a radiator disk is attached to one end of the scroll, while in another embodiment a second disk is attached to the other end of the scroll. In still another embodiment, the axis of the scroll is positioned parallel to the surface of a medium and a right angle acoustic reflector is connected to one end of the scroll to reflect acoustic waves radiated axially by the scroll into the medium. In yet another embodiment, the wideband transducer comprises at least two piezoelectric bimorphs spaced in proximal relation and coupled to the medium.

51 Claims, 9 Drawing Sheets

| Case | $W_2$ | $W_1$ |
|---|---|---|
| 1 | 2.5cm | 2.5cm |
| 2 | 2.5 | 2.08 |
| 3 | 2.5 | 1.78 |
| 4 | 2.5 | 1.56 |
| 5 | 2.5 | 1.38 |
| 6 | 2.5 | 1.25 |

M = AREA OF DISK / EFFECTIVE CROSS-SECTIONAL AREA OF SCROLL

R = RADIUS OF DISK

| M | R |
| --- | --- |
| 1 | 3.78mm |
| 2 | 5.34 |
| 3 | 6.54 |
| 4 | 7.56 |
| 5 | 8.45 |

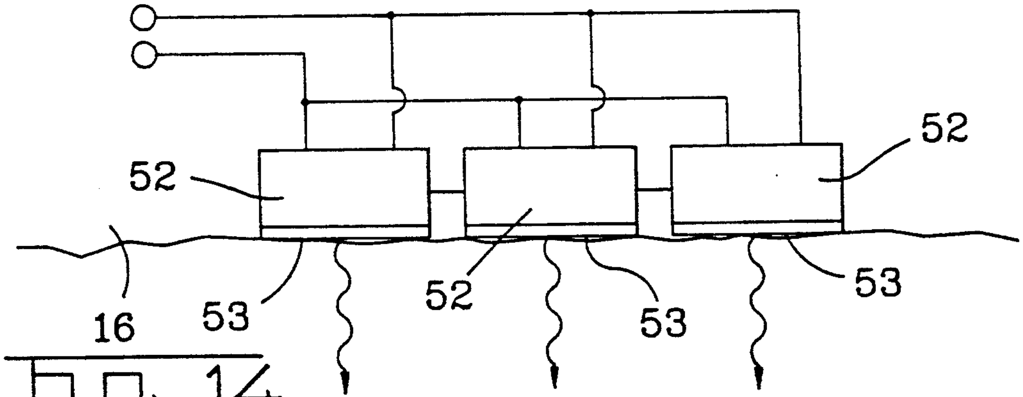
Fig. 14
Fig. 12
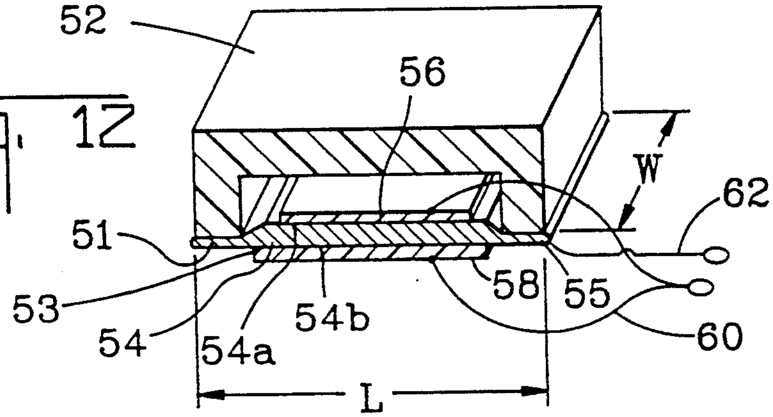
Fig. 13
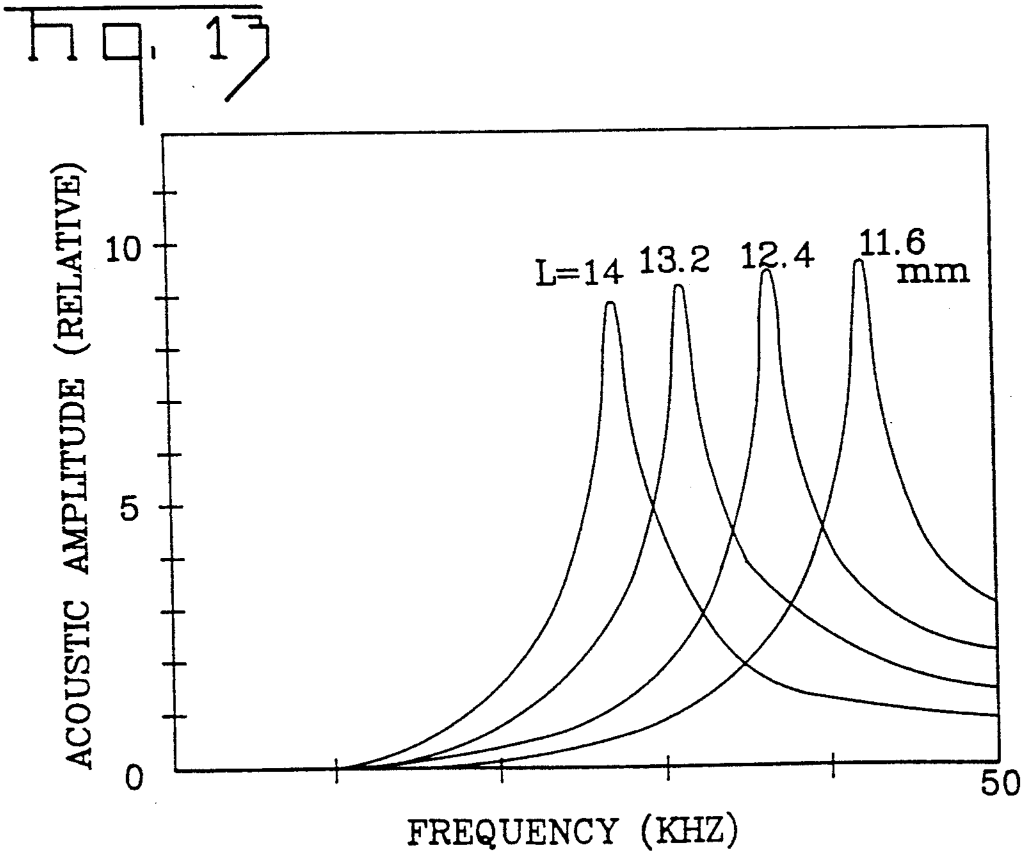

WIDEBAND ULTRASONIC TRANSDUCER

BACKGROUND OF THE INVENTION

1. Field of the Invention

This invention relates generally to piezoelectric transducers and more particularly to a wideband ultrasonic transducer employing piezoelectric transducer elements.

2. Description of the Prior Art

Wideband ultrasonic transducers are generally well known in the fields of medical diagnostics, non-destructive materials testing and underwater echo ranging. Many such transducers employ piezoelectric materials that are stimulated with electrical signals to produce ultrasonic vibrations. Some transducers employ a ceramic piezoelectric material such as lead zirconate titanate (PZT). Others employ piezoelectric polymer materials, such as polyvinylidene fluoride (PVDF) or a copolymer of polyvinylidene fluoride-trifluoroethylene (PVDF-TrFE).

Recently, ultrasonic transducers have found new applications in ultrasonic hearing aids. An ultrasonic hearing aid provides a deaf person with an auditory sense by transmitting ultrasonic waves through a patient's body tissue to the auditory organs. The amplitude of the ultrasonic waves is then modulated by normal sounds in the human auditory range 200 Hz–4 kHz). While deaf persons do not have sensory perception in the normal auditory range of 200 Hz to 4 kHz, it has been found that they often do have perception in the ultrasonic range, and therefore, the modulated ultrasonic waves are perceived by the auditory organs.

Humans, however, are incapable of discerning small frequency variations in the ultrasonic range. Therefore, with ultrasonic hearing aids, the spectrum of audible sounds (200 Hz –4 Khz) must be broadened to cover a broader frequency range prior to modulating those sounds on the ultrasonic waves. Consequently, the ultrasonic transducer supplying the ultrasonic waves must have a correspondingly wide bandwidth. It has been found that a desirable bandwidth for such an ultrasonic transducer is about 20 kHz at a center frequency of about 35 kHz. Unfortunately, piezoelectric transducers typically do not have such wide bandwidths.

However, several techniques are known for broadening the bandwidth of such transducers. For example, one technique for broadening the bandwidth of an ultrasonic transducer is to employ an impedance matching material or layer between the transducer and the radiation medium. As mentioned in U.S. Pat. No. 4,604,542, however, the matching layer must conform to the surface and completely cover the transducer, which makes production more difficult. Also, the thickness of the matching layer has to be a quarter of the wavelength of the material of the matching layer, which restricts the range of operating frequencies in which this technique can be used.

Another technique for obtaining a wide bandwidth device is to employ a plurality of transducer elements, each of which has a different resonant frequency. When operated simultaneously, the individual bandwidths of each transducer element combine to form a wider contiguous frequency band. For example, U.S. Pat. No. 4,916,675 discloses a wideband transducer employing such a technique. The transducer of the '675 patent comprises a plurality of transducer rings positioned side-by-side along a common axis. Each ring consists of a plurality of individual radially directed transducer elements located side-by-side around the circumference of the ring. The individual transducer elements are of the Tonpilz type which comprise a stack of piezoelectric oscillating members positioned between a resonant mass and a counter mass. The resonant frequency of the transducer elements of each transducer ring differs from the resonant frequency of the transducer elements of adjacent rings. The resonant frequencies are spaced such that the bandwidths of each transducer ring combine to cover a wide frequency band.

Similarly, U.S. Pat. No. 4,633,119 discloses a wideband longitudinal transducer comprising a laminar head mass section coupled to electromechanical transducer elements. The head mass section includes a forward head mass, a compliant member abutting the forward head mass and a rear head mass abutting the compliant member and the transducer elements. The compliant member allows the head mass section to mechanically resonate in at least two frequencies thereby expanding the bandwidth of the transducer.

Unfortunately, both the wideband transducer of the '675 patent and the wideband transducer of the '119 patent are complex devices requiring significant manufacturing efforts. Additionally, these transducers were not designed for transmission of ultrasonic waves through human tissue, and their physical geometries preclude such uses. Furthermore, they are not easily adapted to cover different desired frequency bands. There is a need, therefore, for a wideband ultrasonic transducer suitable for sending ultrasonic waves through body tissue with a bandwidth of about 20 kHz. Additionally, there is a need for a wideband transducer having these characteristics that is also easy to manufacture and that is easily adaptable to cover different frequency bands. The present invention satisfies these needs.

SUMMARY OF THE INVENTION

The present invention comprises a wideband ultrasonic transducer. In a preferred embodiment, the wideband transducer comprises at least two stretched piezoelectric polymer films rolled together in a lengthwise direction so as to form a scroll having an axis parallel to a stretch direction of the polymer films. Preferably, the polymer films are connected end-to-end, for example by tape, prior to rolling them together to form the scroll. The polymer films also have different widths W in a longitudinal direction of the scroll which are related to respective acoustic wavelengths λ of the polymer films whereby a resonant frequency of each polymer film is selected by varying the widths W of each film. The resonant frequencies of the polymer films are selected so as to occupy a desired contiguous frequency band. For application to ultrasonic hearing aids, the desired contiguous frequency band of the transducer is substantially centered at 35 kHz with a bandwidth of approximately 20 kHz. The transducer preferably further comprises means for applying an electric field to each of the polymer films in parallel so as to induce expansion or shrinkage of the polymer films in their stretched directions, thereby causing resonance at the respective resonance frequencies of the polymer films.

Preferably, each of the polymer films comprises polyvinylidene fluoride (PVDF), or alternatively, a copolymer of polyvinylidene fluoride-trifluoroethylene (PVDF-TrFE). The electric field applying means preferably comprises silver ink and an elastically soft binding material applied to respective upper and lower surfaces of each of the polymer films so as to form electrodes. In a preferred embodiment, the silver ink and binding material are coated on the polymer films to a thickness of at least 7 microns. The elastically soft binding material is preferably a polymer or organic material, such as rubber, for example.

In a most preferred embodiment, each polymer film comprises a double-layer film having an upper layer and a lower layer with each layer having electrodes on respective surfaces thereof. The two layers are bonded to each other to form a sandwich structure such that their stretch directions are aligned and the electrodes on one surface of each layer are electrically connected. The electric field applying means applies an electric field across the thickness of each layer between the connected electrodes and the electrodes on the other surface of each layer.

In an alternative embodiment, the transducer further comprises a radiator disk attached at a center portion thereof to one end of the scroll. The radiator disk is positioned normal to the end of the scroll and has a cross-sectional area M times greater than a cross-sectional area of the end of the scroll, where M is a positive number. Preferably, M is greater than or equal to two (M> =2). The radiator disk resonates in a plate flexural mode and the resonant frequency of the disk is greater than the resonant frequency of the transducer element. The radiator disk is further adapted to provide for acoustic matching between the transducer and a medium to which the transducer is coupled.

According to yet another embodiment, the wideband transducer of the present invention further comprises a second radiator disk attached at a center portion thereof to the other end of the scroll. The second radiator disk is also positioned normal to the end of the scroll. When such a second radiator disk is used, a shorter scroll length is possible. The radiator disks are preferably made of a metal, such as iron, for example.

According to still another embodiment, the axis of the scroll is positioned parallel to the surface of the medium, and the transducer further comprises a right angle acoustical reflector connected to the scroll. The reflector is operative to reflect acoustic waves radiated axially by the scroll into the medium. The acoustical reflector preferably comprises a rigid housing having a high acoustical impedance and first and second ends, where the first end is coupled to one end of the scroll so as to form a reflecting surface positioned at a forty-five degree (45°) angle to the axis of the scroll. An impedance matching member preferably occupies the space between the end of the scroll and the reflecting surface and is coupled to the medium for providing impedance matching between the scroll and the medium. The second end of the rigid housing may be connected at the other end of the scroll, in which case the scroll has a length substantially equal to $\lambda/4$. Alteratively, the second end of the rigid housing may be clamped about the longitudinal midpoint of the scroll, in which case the scroll has a length substantially equal to $\lambda/2$. Additionally, the scroll may be squeezed by the reflector housing into an elliptical shape. The reflector housing preferably is formed of metal, and when the medium is human tissue, the impedance matching member preferably is formed of rubber or plastic.

According to yet another embodiment, the wideband ultrasonic transducer of the present invention comprises at least two piezoelectric bimorphs spaced in proximal relation and coupled to a medium, where each of the bimorphs has a different length L and is elastically supported at first and second ends. The length L of each bimorph is related to a resonant frequency of that bimorph whereby the resonant frequency of each bimorph may be selected by varying the lengths L. The resonant frequency of each bimorph is selected such that the bandwidths of each bimorph combine to occupy a desired contiguous frequency band. For application to ultrasonic hearing aids, the desired contiguous frequency band of the transducer is substantially centered at 35 kHz with a bandwidth of approximately 20 kHz. Preferably, the transducer further comprises means for applying an oscillating electric signal to each of the piezoelectric bimorphs in parallel so as to induce simultaneous vibrations of the bimorphs at their respective resonant frequencies, thereby causing the bimorphs to radiate acoustic waves into the medium.

Each of the piezoelectric bimorphs preferably comprises a central member having an upper surface and a lower surface and a length L. An upper piezoelectric layer is bonded to the upper surface of the central member and is poled in the thickness direction. A lower piezoelectric layer is bonded to the lower surface of the central member and is poled in the thickness direction. The upper and lower piezoelectric layers preferably are formed of lead-zirconate-titanate (PZT), while the central member preferably is made of aluminum. Preferably, the bimorph further comprises means for applying an oscillating electric field to each of the upper and lower piezoelectric layers so as to induce alternating expansions of one layer and contractions of the other, thereby causing the bimorph to resonate at the resonant frequency.

In still another embodiment, the transducer of the present invention comprises a single stretched piezoelectric polymer film rolled in a lengthwise direction thereof so as to form a scroll. A radiator disk is attached at a center portion thereof to one end of the single film scroll. The radiator disk is positioned normal to the end of said scroll and has a cross-sectional area M times greater than the cross-sectional area of the end of the scroll, where M is a positive number. Preferably, M is greater than or equal to two (2). The transducer further comprises means for applying an electric field across the thickness of the scrolled polymer film so as to induce expansion or shrinkage of the film in its stretched direction. The stretched direction of the film is parallel to the axis of the scroll. In yet another embodiment, a second radiator disk is attached to the other end of the single film scroll.

Further details of the present invention will become evident hereinafter.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings embodiments that are preferred, it being understood, however, that the invention is not limited to the specific methods and instrumentalities disclosed. In the drawings:

FIG. 8 shows theoretical frequency response curves for a transducer such as that of FIGS. 4A-b for different radiator disk diameters assuming a single film scroll formed of PVDF-TrFE;

FIG. 12 is a perspective view of a PZT bimorph for radiating ultrasonic waves;

FIG. 13 shows theoretical frequency response curves for the PZT bimorph of FIG. 12 for different lengths of the bimorph; and FIG. 14 is a front view of a wideband ultrasonic transducer employing a plurality of PZT bimorphs in accordance with a fifth embodiment of the present invention.

DETAILED DESCRIPTION OF THE PREFERRED EMBODIMENTS

Figure 1A:
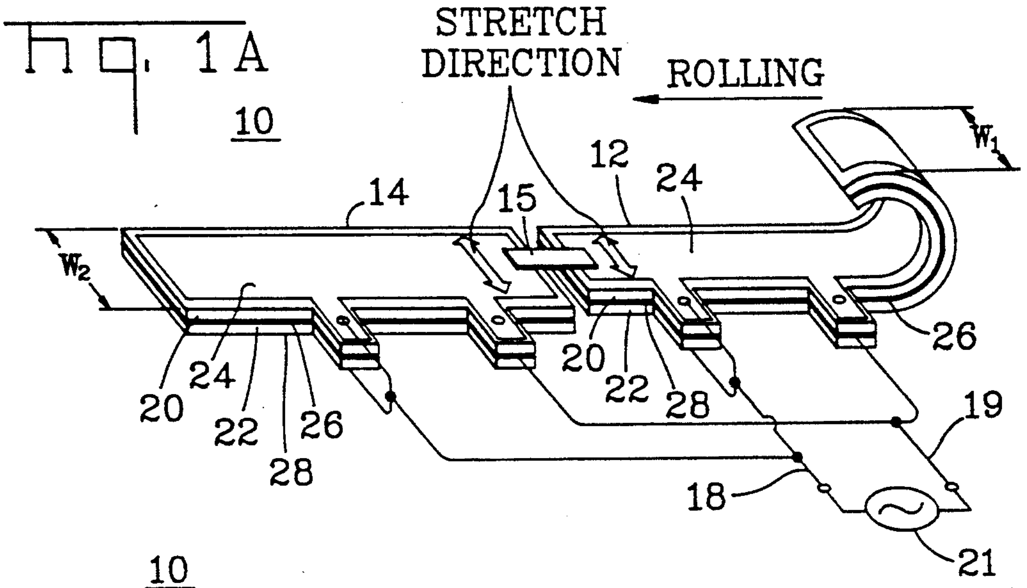
FIG. 1A shows a perspective illustration of the construction of a wideband ultrasonic transducer comprising at least two poled piezoelectric polymer films rolled together in a lengthwise direction so as to form a scroll in accordance with a first embodiment of the present invention.

Referring to the drawings in detail, like numerals indicate like elements throughout. As explained in the Background of the Invention, there is a need for a wideband ultrasonic transducer suitable for sending ultrasonic waves through body tissue with a bandwidth of about 20 kHz centered at about 35 kHz. Additionally, such a transducer should be easy to manufacture and easily adaptable to cover different frequency bands. The present invention satisfies these needs. Preferred embodiments of the present invention are described hereinafter.

First Embodiment

In accordance with a first embodiment of the present invention, a wideband ultrasonic transducer comprises at least two stretched piezoelectric polymer films rolled together in a lengthwise direction so as to form a scroll. Preferably, the piezoelectric films are connected end-to-end prior to rolling them together to form the scroll. Rolling a single piezoelectric polymer film into a scroll to form a "cylindrical" or "scrolled" transducer is generally known. For example, such a technique is described in detail in an article by D.H. Dameron and J.G. Linvill, entitled "Cylindrical $PVF_2$ Electromechanical Transducers," *Sensors and Actuators* (1981/82), vol. 2, pp. 73-84. According to the present invention, however, a wideband cylindrical transducer is constructed by rolling together a multiplicity of long piezoelectric polymer films having different widths so as to form a single scrolled structure. Generally, the axis of the scroll is parallel to the stretch directions of the films so that an electric field applied across the thickness of each film induces expansion or shrinkage of the scroll in a direction parallel to the axis of the scroll. Such scrolled transducers, therefore, vibrate axially.

Figure 1B:
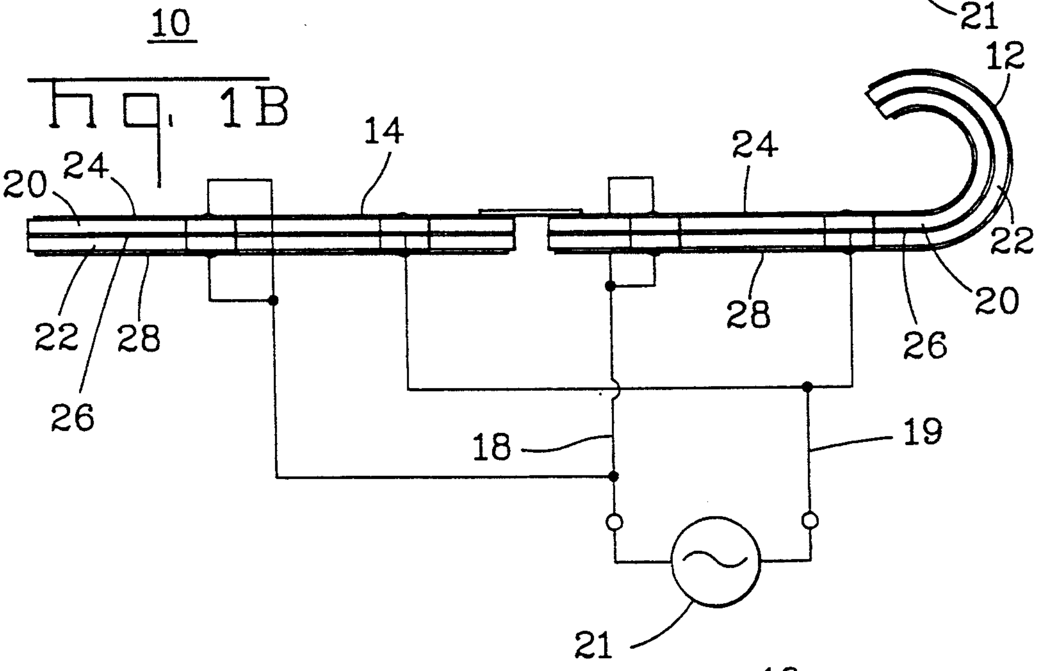
FIG. 1B is a side view of the transducer illustrated in FIG. 1A.
Figure 1C:
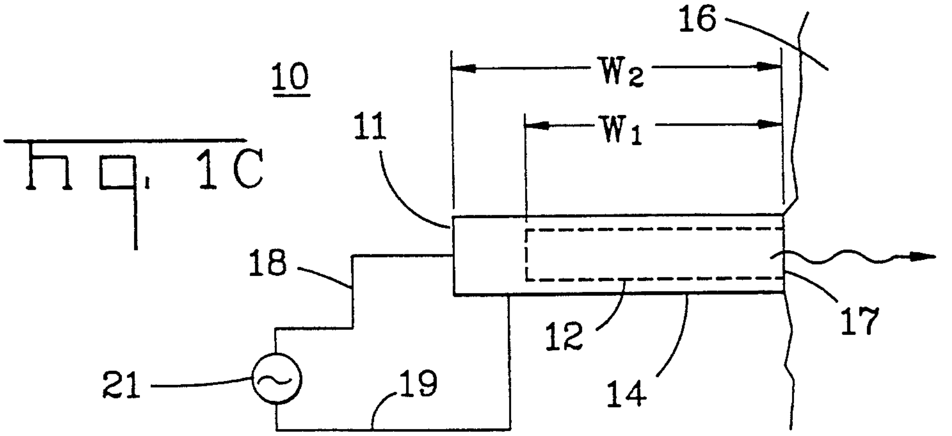
FIG. 1C is a side view of the scrolled transducer of FIGS. 1A and 1B fully constructed and coupled to a medium.

As best shown in FIG. 1A, in accordance with the first embodiment, transducer 10 comprises first and second piezoelectric polymer films 12 and 14 which are rolled together in a lengthwise direction to form a scroll 11 (FIG. 1C). Preferably, the films 12, 14 are connected end-to-end by tape 15 prior to rolling them together. As indicated in FIG. IA by the arrows, each film 12, 14 has a stretch direction parallel to the axis of the scroll 11. The first film 12 has a width $W_1$ which extends in a longitudinal direction of the scroll 11, while the second film 12 has a width $W_2$. The widths W of each scroll are related to respective acoustic wavelengths λ of the films 12, 14. Consequently, as described hereinafter in greater detail, the resonant frequency of each polymer film 12, 14 may be selected by varying the respective widths $W_1$, $W_2$ of the films.

The first and second polymer films 12, 14 are electrically connected in parallel by electrode wires 18 and 19 for applying the same electric field from voltage source 21 to each film 12, 14 so as to induce expansion or shrinkage of the films 12, 14 in their stretch directions parallel to the axis of the scroll. When a suitable oscillating signal is applied to the films 12, 14, the films resonate at their respective resonant frequencies. According to the present invention, the widths $W_1$ and $W_2$ of each film are selected such that the resonant frequencies of the films 12, 14 occupy a desired contiguous frequency band. In a preferred embodiment, the desired frequency band of the transducer 10 is substantially centered at 35 kHz with a bandwidth of approximately 20 kHz.

FIG. 1B illustrates a side view of the transducer 10 of FIG. 1A. As best shown in FIG. 1B, each polymer film 12, 14 preferably comprises a double-layer film having an upper layer 20 and a lower layer 22 of polymer film. The thickness of each layer 20, 22 is approximately 0.0028 cm and the length is approximately 40 cm. As mentioned above, the widths of the respective layers 20, 22, and therefore of each film 12, 14, are selected to achieve the desired resonant frequency of each film 12, 14. For example, for a resonant frequency of 45 kHz, the corresponding width $W_1$ would be 1.4 cm, while for a resonant frequency of 35 kHz the corresponding width $W_2$ would be 2.0 cm. In the first embodiment, the piezoelectric layers 20, 22 are formed of polyvinylidene fluoride (PVDF); however, any suitable piezoelectric polymer such as a copolymer of polyvinylidene fluoride-trifluoroethylene (PVDF-TrFE) may be used.

Each polymer film layer 20, 22 has a thin electrode layer deposited over both its surfaces. As shown in FIG. 1B, the layers 20, 22 of each film 12, 14 are bonded to each other such that the electrodes on the bonded sides electrically connect to form a central electrode 26. Thus, the upper piezoelectric layer 20 of each film 12, 14 has an electrode layer 24 on its upper surface, the lower piezoelectric layer 22 has an electrode layer 28 on its lower surface, and a common electrode layer 26 lies between the film layers 20, 22. The structure of each film 12, 14 therefore resembles a sandwich. In addition, the film layers 20, 22 are bonded such that their respective stretch directions are aligned.

FIG. 1B further illustrates that the electrodes 24 and 28 of each polymer film 12, 14 are electrically coupled together by electrode wire 18. Similarly, the common electrodes 26 of each film 12, 14 are electrically coupled by electrode wire 19. The electrode wires 18 and 19 are in turn coupled to respective terminals of a voltage source 21; therefore, the piezoelectric polymer films 12, 14 are electrically connected in parallel. The double-layered or sandwich structure of the films 12, 14 is necessary to avoid electrical shorting between the electrodes on opposite surfaces of the individual layers 20, 22 of each film 12, 14. If only a single-layer film were employed, the electrode layer on the upper surface of the film and the electrode layer on the lower surface would be shorted when the film is rolled into a scroll. Thus, the double-layer film structure solves this shorting problem. In the aforementioned article by Dameron and Linvill, at p. 78, another method is disclosed for dealing with the shorting problem wherein a single-layer film is folded prior to scrolling.

Figure 1D:
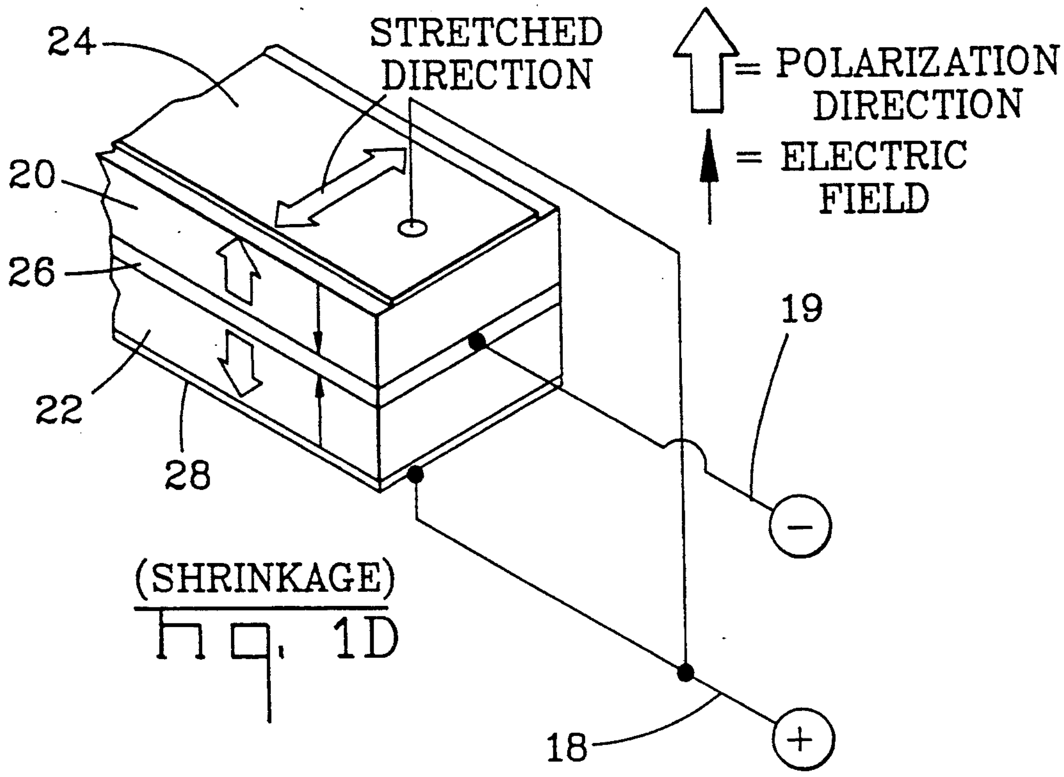
FIG. 1D illustrates the reaction of a doublelayer piezoelectric polymer film in response to an applied voltage having the polarity shown.
Figure 1E:
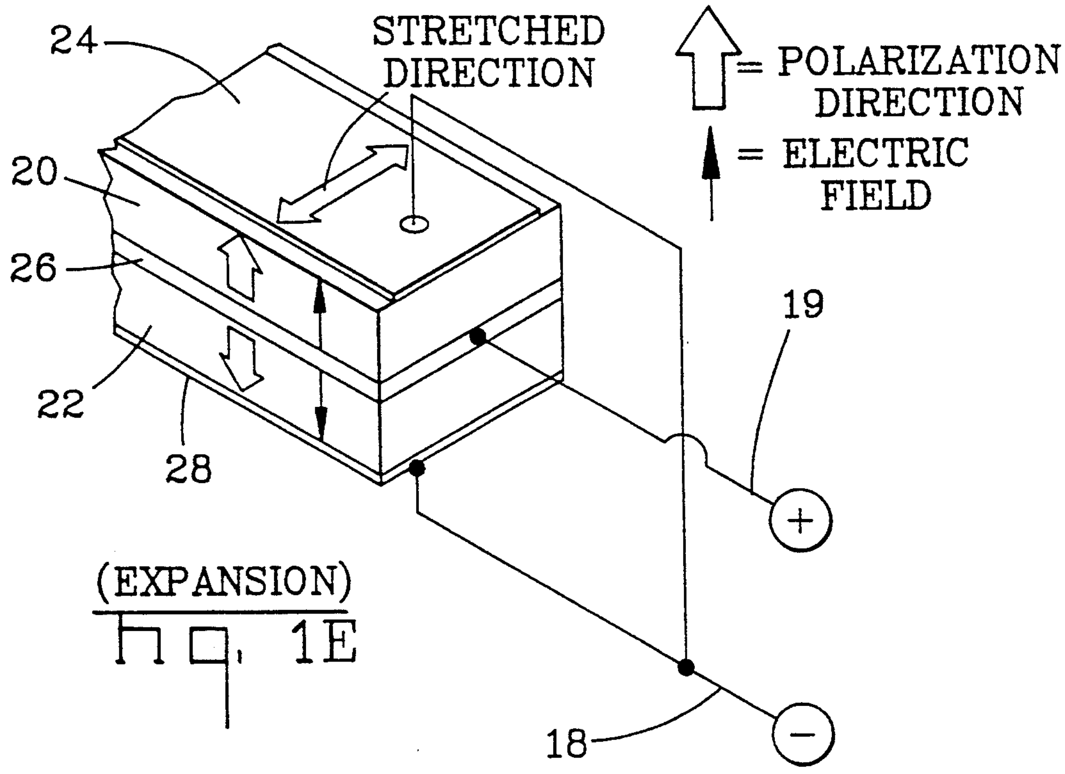
FIG. 1E illustrates the reaction of a double-layer piezoelectric polymer film in response to an applied voltage having a polarity opposite that shown in FIG. 1D.

When a voltage is applied across the electrode wires 18 and 19, an electric field will be produced across the thickness of each layer 20, 22 of each film 12, 14. FIGS. 1D and 1E illustrate the application of an electric field across layers 20 and 22 of one film (e.g. film 12 or 14). As is shown, each piezoelectric polymer layer 20, 22 is polarized in its thickness direction. A piezoelectric film's reaction to an applied voltage depends upon the relationship between the polarization direction of the film and the direction of the applied electric field. As FIGS. 1D and 1E illustrate, the polarization directions of the two film layers 20, 22 are arranged such that when an electric field is applied, the relationship between the polarization direction and electric field direction is the same in both layers. Consequently, both layers will respond the same when a given voltage is applied across electrode wires 18 and 19.

For example, as illustrated in FIG. 1D, a voltage applied across electrode wires 18 and 19, having the polarity shown, produces an electric field across the thickness of each layer 20, 22 as indicated by the arrows. In each layer, the electric field direction is opposite the polarization direction. Consequently, both layers will simultaneously shrink in their stretched directions. On the contrary, as illustrated in FIG. 1E, when the polarity of the voltage is reversed, the electric fields produced in each layer 20, 22 have the same direction as the polarization direction of each layer. In this example, therefore, both layers 20, 22 will expand along their stretch directions. Thus, depending upon the polarity of the voltage applied across electrode wires 18 and 19, the layers 20, 22 of each film 12, 14 will expand or shrink in unison along their stretch directions. When an oscillating voltage signal is applied across electrode wires 18 and 19, the scrolled films 12, 14 will vibrate axially at their respective resonant frequencies.

As mentioned previously, it is desirable in a preferred embodiment for the operational frequency band of the transducer 10 to have a bandwidth of approximately 20 kHz centered at about 35 kHz. The maximum bandwidth of a single scrolled film, such as film 12 or 14, is about 10 kHz. Thus, in accordance with the present invention, the two films 12 and 14 are employed at different resonant frequencies so that their respective bandwidths combine to occupy the desired frequency band. As explained, the width W of each film 12, 14 determines its resonant frequency. Resonance occurs at a given frequency when the width W of the film is equal to one-half the acoustic wavelength (i.e., $\lambda/2$) for that frequency. Thus, as noted above, to achieve half-wavelength resonance at 35 kHz, the width of a scrolled film would have to be 2 cm. For half-wavelength resonance at 45 kHz, the width W would be 1.4 cm.

Figure 2A:
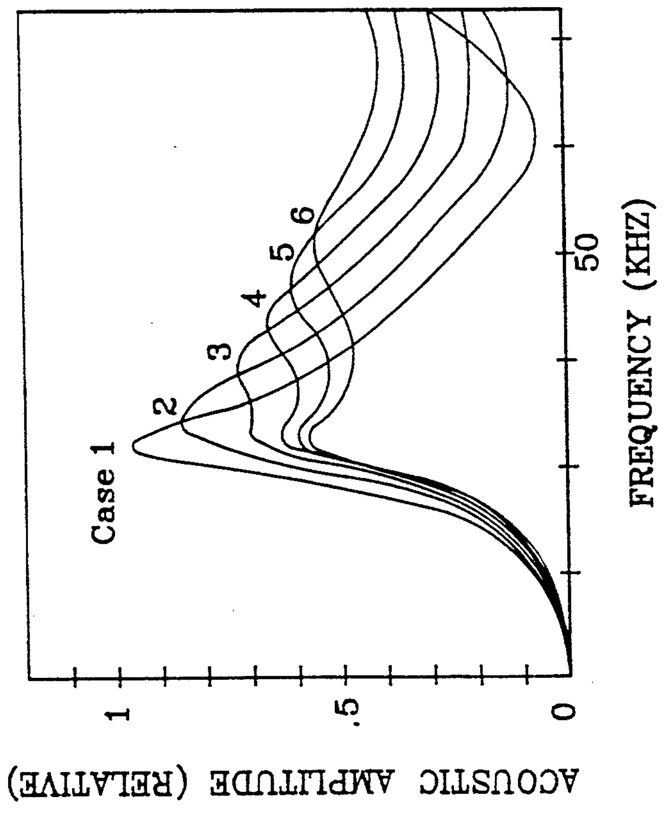
FIG. 2A shows theoretically calculated frequency response curves for the wideband ultrasonic transducer of FIGS. 1A-E for different piezoelectric polymer film widths.

FIG. 2A shows frequency response curves for the wideband transducer 10 of FIG. 1A. The curves shown in FIG. 2A were theoretically calculated for different widths $W_1$ and $W_2$. As the curves of FIG. 2A indicate, the greater the difference between $W_1$ and $W_2$, the greater the bandwidth of the transducer 10. However, FIG. 2A further illustrates that the greater the difference between $W_1$ and $W_2$, the lower the acoustic output over the combined frequency band. Accordingly, to achieve wider frequency bands without significant reduction in acoustic output, three or more piezoelectric polymer films may be rolled together (rather than just the two shown in FIGS. 1A–C) whose widths W differ more slightly from one film to the next.

Figure 2B:
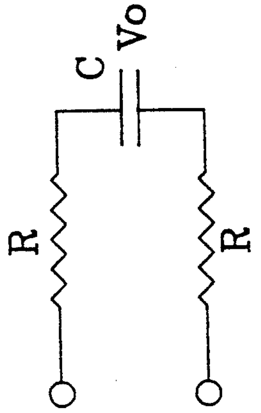
FIG. 2B is an equivalent electrical circuit model of a piezoelectric polymer film, as in FIGS. 1A-E, having an electrode material deposited over its upper and lower surfaces.

To operate the wideband transducer 10 at frequencies in the range of 25–45 kHz, the sheet resistivity of the electrode layers 24, 26 and 28 must be low enough so as to prevent excessive voltage drop over the length of the layer. FIG. 2B is an electrical circuit model of a single piezoelectric film having electrode layers on its upper and lower surfaces. The resistors R represent the electrode layers, and the capacitor C represents the piezoelectric film. If $R > 1/\omega C$, the voltage $V_o$ across the thickness of the film is reduced. A reduced voltage $V_o$ across the film results in reduced expansion and contraction of the film, and hence lower acoustic output.

The capacitance of a single strip of piezoelectric film of dimensions 40 cm.×1.5 cm×0.0028 cm is 22.8 nF, and the reactance at 35 kHz is 199Ω. A purely metallic electrode layer of a few thousand angstroms deposited by sputtering or evaporation has a resistance of 100–200Ω from end to end which is too high for the application. Accordingly, in the first embodiment, in order to reduce the resistance of the electrode layers 24, 26 and 28, an electrode material consisting of silver ink powder and an elastically soft binding material is used. The elastically soft binding material may be a polymer or organic material, such as rubber, for example. The silver ink achieves a resistance of approximately 5Ω from end to end when the thickness of the silver ink layer is at least 7 microns.

When combined with the elastically soft binding material, the silver ink electrode layers have the additional effect of reducing the width W of the film needed to achieve half-wavelength resonance at a given frequency. This is because the heavy mass of silver powder increases the total mass of the film. For example, to achieve half-wavelength resonance at 35 kHz, the width of a piezoelectric polymer film must normally be about 2.8 cm. However, with an 8 micron electrode layer consisting of silver ink and an elastically soft binding material, the necessary width for the half-wavelength resonant condition at 35 kHz reduces to about 1.8 cm. Shorter width films are more desirable as discussed hereinafter.

FIG. 1C illustrates a fully rolled scroll 11 coupled to a medium 16. The scroll 11 has a substantially flat first end 17 which is coupled to the medium such that the axis of the scroll 11 is normal to the surface of the medium. When an oscillating signal is applied to the scroll 11 via wires 18 and 19, the scroll vibrates axially and radiates acoustic waves into the medium. Although a preferred application of the transducer 10 of the present invention is for radiation of acoustic waves into human tissue to promote hearing in deaf persons, the transducer 10 may be employed to radiate acoustic waves into a wide variety of radiation media. Also, the scroll 11 may comprise three or more strips with different widths $W_N$ to cover a wider frequency range as desired without a significant reduction in acoustic output.

Second Embodiment

Figure 3A:
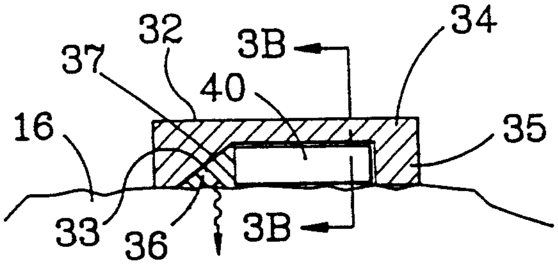
FIG. 3A is a side view of a wideband ultrasonic transducer, such as that of FIGS. 1A-E, further comprising a right angle acoustic reflector in accordance with a second embodiment of the present invention.
Figure 3B:
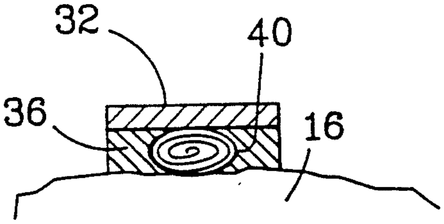
FIG. 3B is a rear view of the transducer of FIG. 3A taken along line 3—3 of FIG. 3A.
Figure 3C:
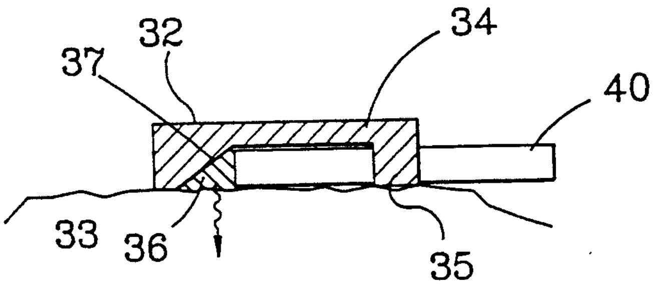
FIG. 3C is a side view of the transducer of FIG. 3A employing a different right angle acoustic reflector.

A scrolled piezoelectric polymer film transducer positioned with its axis normal to the surface of a medium can be awkward because the length of the scroll extends outward from the medium. FIGS. 3A–C illustrate a second embodiment of the wideband ultrasonic transducer of the present invention that provides a solution to this problem. In the second embodiment, a scroll 40 is positioned with its axis parallel to the surface of the medium 16, and the transducer further comprises a right angle acoustic reflector 32 connected to the scroll 11 for reflection the acoustic waves radiated axially by the scroll into the medium 16. The scroll 40 may comprise a scroll such as that illustrated in FIGS. 1A–E (i.e., scroll 11) which is constructed by rolling two or more polymer films together. Alternatively, the scroll 40 may comprise only a single piezoelectric polymer film rolled in a lengthwise direction.

As best shown in FIG. 3A, the right angle acoustic reflector 32 comprises a rigid housing 34. The housing 34 has a first end 33 coupled to the scroll 40 that forms a a reflecting surface 37 positioned at about a forty-five degree (45°) angle to the axis of the scroll 40. The reflector 32 further comprises an impedance matching member 36 in the shape of a right triangle. The impedance matching member 36 occupies the space between the end of the scroll 40 and the reflecting surface 37 of the housing 34. In the present embodiment, the housing 34 is preferably made of a material having a high acoustic impedance, such as metal, while the impedance matching member 36 is preferably made of a material having an acoustic impedance between that of the medium and the piezoelectric film scroll, such as plastic or rubber for the case where the medium is human tissue.

In use, the acoustic waves radiated axially by the scroll 40 are transmitted parallel to the surface of the medium through the impedance matching member 36 to the reflecting surface 37. The acoustic waves are then reflected ninety degrees by the reflecting surface 37 and transmitted through the impedance matching member 36 into the medium 16. As mentioned, the impedance matching member 36 provides acoustic matching between the scroll 40 and the medium 16.

As shown in FIG. 3A, a second end 35 of the housing 32 is connected at the other end of the scroll 40. In such a case, the scroll 40 has a length substantially equal to λ/4. Alteratiely, as shown in FIG. 3C, the second end 35 of the housing 34 may be clamped about the longitudinal midpoint of the scroll 40, in which case the scroll 40 may have a length substantially equal to λ/2. Finally, as illustrated in FIG. 3B, which is a rear view of the transducer of FIG. 3A taken along line 3-3 of FIG. 3A, the cylindrical transducer element may be squeezed by the reflector 32 into an elliptical shape to further reduce the height of the structure above the surface of the medium 16.

Third Embodiment

In a conventional impedance matching scheme, such as that seen in medical transducers in the megahertz range, an impedance matching layer is inserted between the transducer and the medium to widen the frequency response of the transducer. In this higher frequency case (i.e., megahertz), the impedance matching layer has the same cross-sectional area as the transducer, and the thickness of the layer is typically chosen to be a quarter of the acoustic wavelength. In the 25–45 kHz range of the scrolled transducer of the present invention, however, the conventional design described above does not work effectively because the cross-sectional diameter of a scroll is smaller than the acoustic wavelength at the 25–45 kHz range. Consequently, the acoustic impedance at the front end of the scroll becomes a complex number.

Figure 4A:
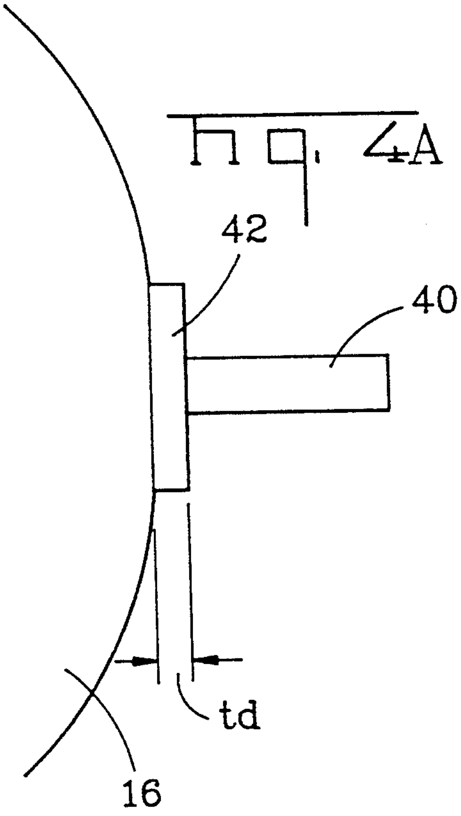
FIG. 4A is a side view of a wideband ultrasonic transducer comprising a piezoelectric polymer film scroll and a radiator disk in accordance with a third embodiment of the present invention.

FIG. 4A illustrates a third embodiment of the wideband ultrasonic transducer of the present invention which overcomes the problem described above. In the third embodiment, the wideband ultrasonic transducer comprises a scroll 40 and a radiator disk 42 which functions to broaden the bandwidth of the scroll 40 and a medium 16. The scroll 40 may comprise a scroll such as that illustrated in FIGS. 1A–E (i.e., scroll 1) which is constructed by rolling two or more polymer films together. Alternatively, the scroll 40 may comprise only a single piezoelectric polymer film rolled in a lengthwise direction to form the scroll. The radiator disk 42 is attached at a center portion thereof to one end the scroll 40 such that the disk 42 lies in a plane normal to axis of the scroll 40. The radiator disk 42 has a radius R and a thickness $t_d$. As shown, the radius R of the disk 42 is typically greater than the cross-sectional radius of the scroll 40. The disk 42 has a cross-sectional area M times greater than the cross-sectional area of the end of the scroll 40, where M is preferably greater than or equal to two (2). As best shown in the exploded perspective view of FIG. 4B, the axis of the disk 42 is coextensive with the axis of the scroll 40. Preferably, the radiator disk 42 is made of a hard lightweight material, such as a ceramic material or glass.

As best illustrated in FIG. 4A, in use, the free side of the radiator disk 42 is coupled to the medium 16 such that the axis of the scroll 40 is substantially normal to the surface of the medium 16. The scroll 40 axially radiates acoustic waves into the medium 16. Alternatively, the scroll 40 of FIG. 4A may be positioned with the axis of the scroll 40 parallel to the surface of the medium and a right angel acoustic reflector, such as reflector 32 of FIGS. 3A–C, may be coupled to the radiator disk 42 and to the surface of the medium 16 for reflecting the acoustic waves radiated axially by the scroll into the medium in a manner similar to that described in conjunction with FIGS. 3A–C.

Figure 5:
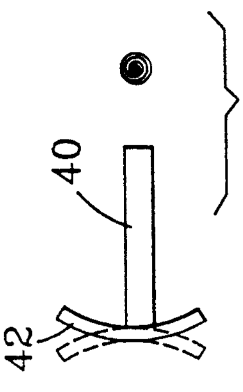
FIG. 5 illustrates flexural motion of a radiator disk caused by axial vibrations of a tightly rolled scroll.

FIG. 5 illustrates the flexural motion of the radiator disk 42 in response to the high frequency axial vibrations of a tightly rolled scroll 40. When the central region of the disk 42 is driven at a high frequency, the outer region moves in the opposite direction as illustrated in FIG. 5 thereby reducing the amount of radiated energy. If the disk 42 has a resonant frequency near the frequency of the axial vibrations of the scroll 40, the overall radiation of the transducer is practically cancelled. One way to prevent this cancellation effect is to ensure that the resonant frequency of the disk 42 is greater than the operating frequency of the scroll 40. In accordance with the present invention, this is achieved by employing a very rigid disk having a thickness of approximately 2.0 mm and a radius of 7 mm. Preferably, the disk is made of a ceramic material or glass, however, a metal disk may be employed.

Figure 6:
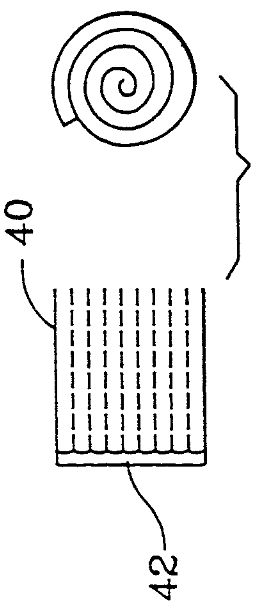
FIG. 6 illustrates flexural motion of a radiator disk caused by axial vibrations of a loosely rolled scroll.

Another method for reducing the cancellation effects of the flexural motion of the radiator disk 42 is illustrated in FIG. 6. As illustrated, the scroll 40 is loosely rolled such that when coupled to the radiator disk 42, the windings of the scroll cover a greater area of the disk 42. Flexural deformation of the disk 42, therefore, occurs periodically over the area of the disk with a very small periodicity. Large flexural motion, such as is shown in FIG. 5, does not occur with a loosely rolled scroll. consequently, a much thinner and less rigid radiator disk may be employed. Also, the spacing between successive windings of the scroll does not have to be constant, and therefore, loosely rolled scrolls can be more easily manufactured.

Figure 4B:
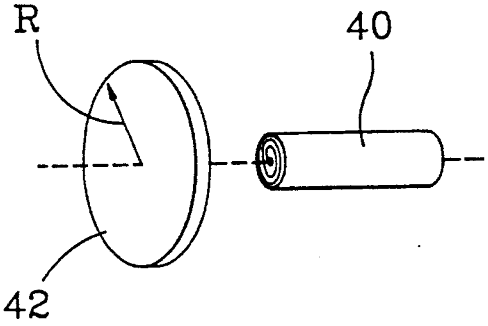
FIG. 4B is an exploded view of the transducer of FIG. 4A.
Figure 7:
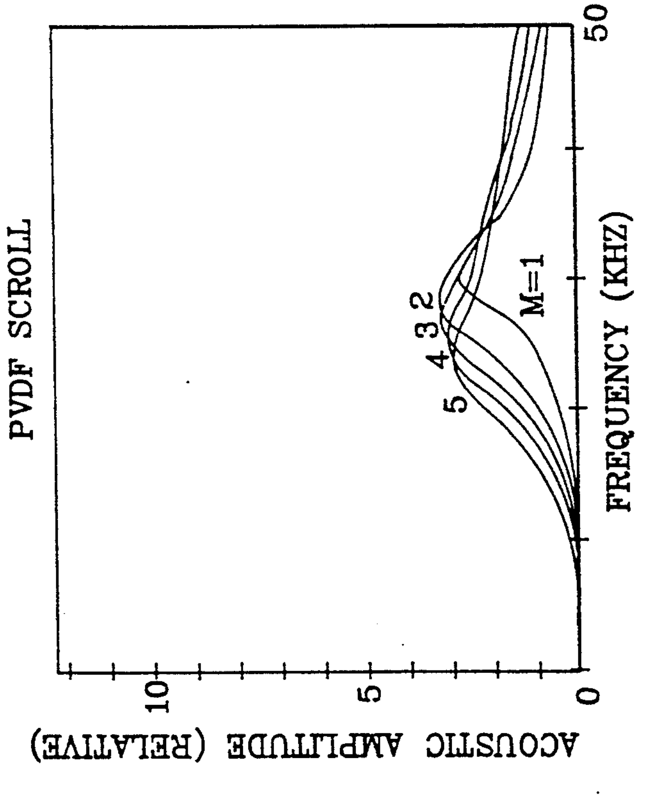
FIG. 7 shows theoretical frequency response curves for a transducer such as that of FIGS. 4A-B for different radiator disk diameters assuming a single film scroll formed of PVDF.
Figure 6:
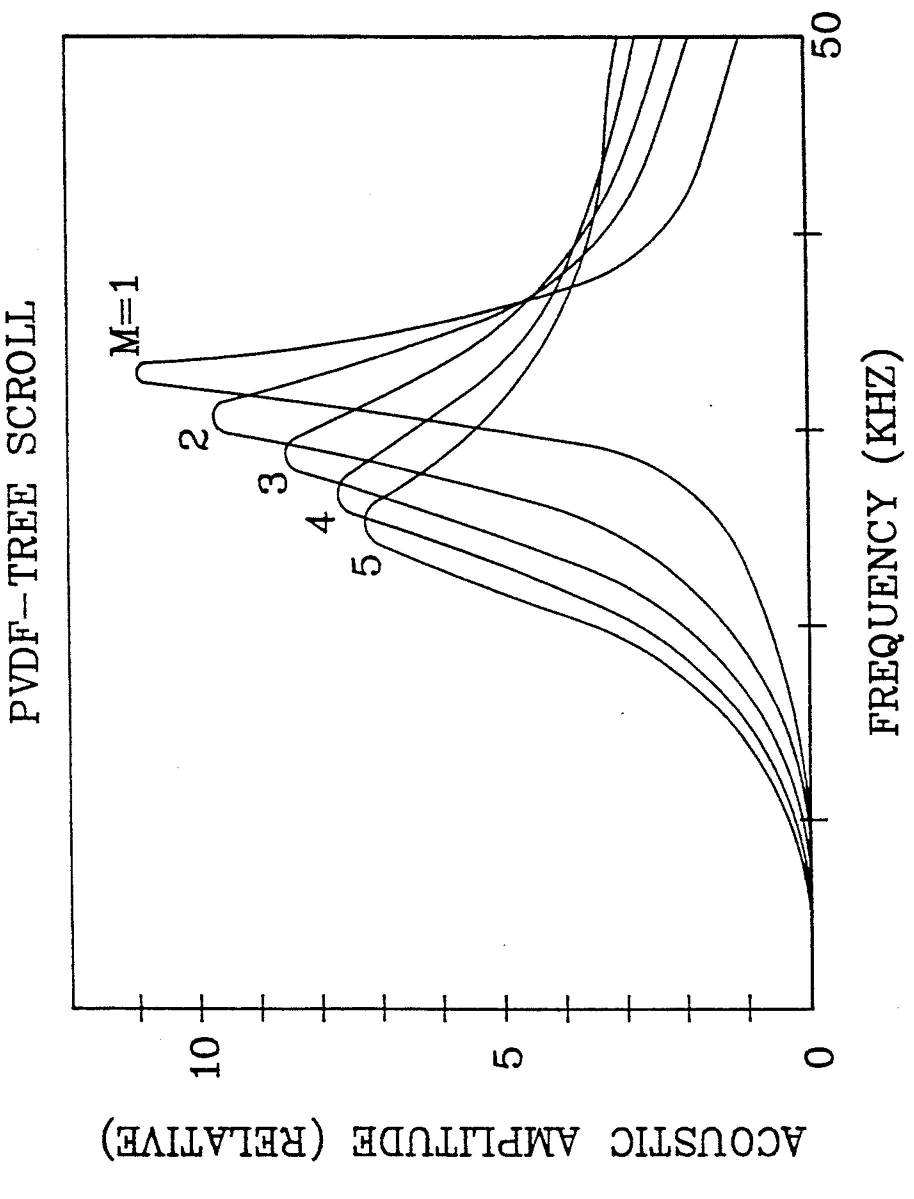

FIG. 7 depicts frequency response curves of the transducer of FIGS. 4A–B for different radiator disk radii R. The curves of FIG. 7 were theoretically calculated assuming a single film scroll formed of PVDF with a length (i.e., film width of 2.5 cm. Frequency response curves are shown for different M, where M is the ratio of the area of the radiator disk surface to the effective cross-sectional area of the scroll (excluding area occupied by the electrode layers and any spacing between scrolled layers). As can be seen, the larger the radiator disk 42, the wider the bandwidth of the transducer. In the case of M equal to two ($M=2$), the half-value bandwidth increases by about fifty percent (50%). When M is greater than three ($M>3$), the bandwidth increases by more than one-hundred percent (100%). However, the larger the disk 42, the lesser the acoustic output.

FIG. 8 is similar to FIG. 7 except that the frequency response curves were theoretically calculated assuming a single film scroll formed of a copolymer of PVDF-TrFE having a length of 3.5 cm. Again, in FIG. 8, M is the ratio of the area of the radiator disk surface to the effective cross-sectional area of the scroll (excluding area occupied by the electrode layers and any spacing between scrolled layers). The curves show the frequency response for different M. Again, as can be seen, the larger the radiator disk 42, the wider the bandwidth of the transducer 10. When M is greater than two ($M>2$), the half-value bandwidth increases by more than eighty percent (80%). However, the larger the disk 42, the lesser the acoustic output. The theoretical frequency response curves of FIGS. 7 and 8 are accurate for both tightly and loosely rolled scrolls.

Fourth Embodiment

Figure 9A:
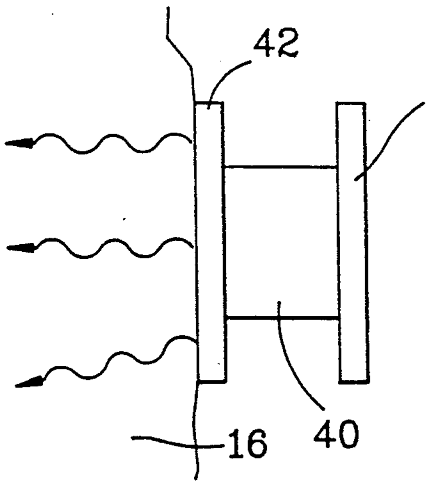
FIG. 9A is a side view of the transducer of FIGS. 4A-B further comprising a second disk in accordance with a fourth embodiment of the present invention.
Figure 9B:
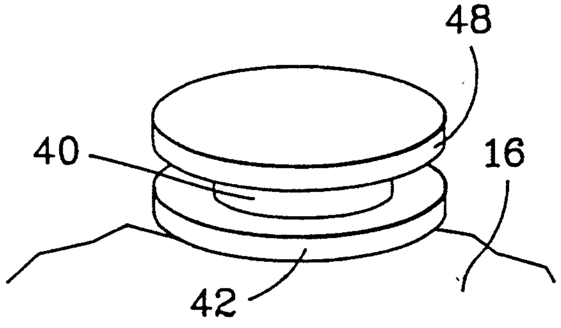
FIG. 9B is a perspective view of the transducer of FIG. 9A.

As with any scroll, when a scroll having a radiator disk, such as that shown in FIGS. 4A–B, is coupled to a medium with its axis normal to the surface of the medium, the length of the scroll becomes awkward. In accordance with a fourth embodiment of the present invention a second disk 48 may be coupled to the other end of a scroll 40 as shown in FIGS. 9A and 9B. As best shown in FIG. 9A, the plane of the second disk 48 is parallel to the plane of the radiator disk 42. Each disk has a thickness $t_d$ and a radius r. Preferably, both disks are formed of a metal, such as iron. Because of its mass, the second disk 48 operates in conjunction with the first disk to decrease the resonant frequency of the scroll 40 for a given length L. Therefore, a shorter length scroll may be used to achieve the same resonant frequency. For example, by adding the second disk 48, a piezoelectric film having a width W less than or equal to one-fourth the acoustic wavelength (i.e., $W<=\lambda/4$) may be used to achieve the same resonant frequency as a film having a half-wavelength width (i.e., $W=\lambda/2$) without the second disk 48. FIG. 9B is a perspective view of the transducer of FIG. 9A illustrating the reduced height achieved by the use of the second disk 48.

Figure 10:
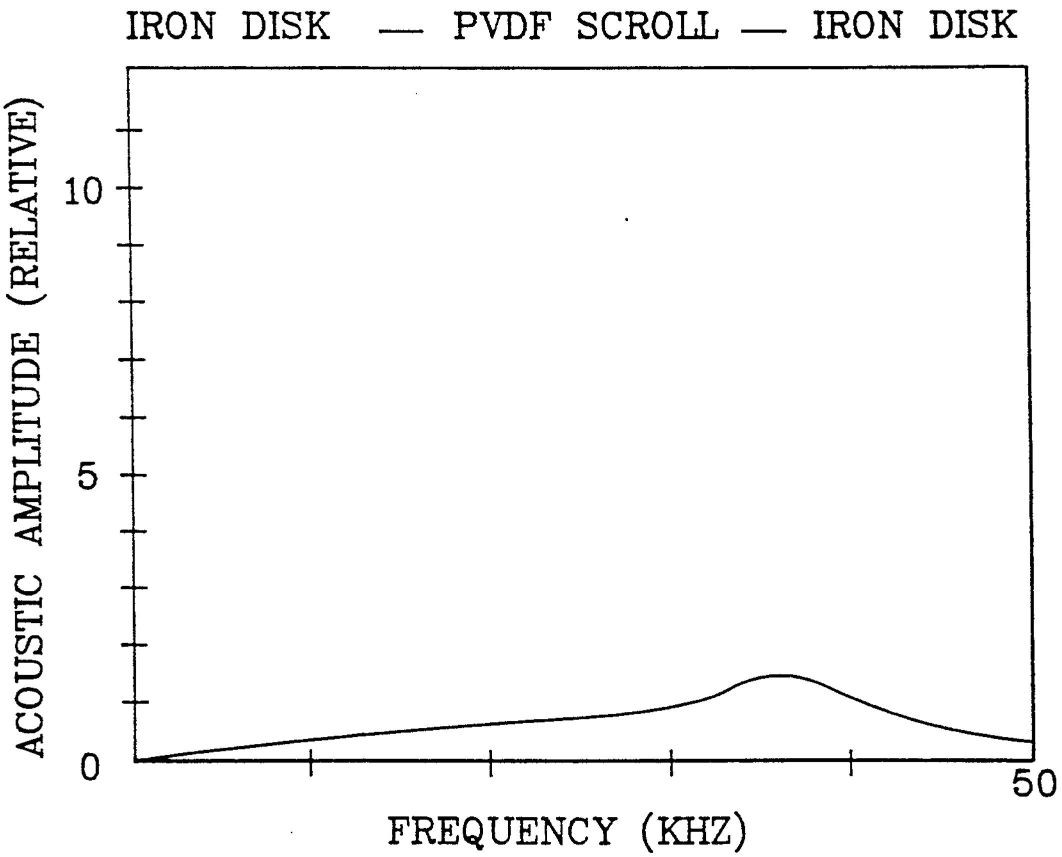
FIG. 10 shows theoretical frequency response curves for a transducer such at that shown in FIGS. 9A-B assuming a single film scroll formed of PVDF.

FIG. 10 shows theoretical frequency response curves for the transducer of FIGS. 9A–B assuming a single film scroll formed of PVDF. The radiator disk 42 and second disk 48 are made of metal (e.g., iron), and each has a diameter (D) of 2.0 cm and a thickness ($t_d$) of 1.5 mm. The length L of the scroll 40 is 3 mm. As can be seen, when the two disks 42, 48 are employed, the relatively short length (3 mm) of the scroll 40 is adequate to achieve a wideband frequency response centered at approximately 35 kHz.

Figure 11:
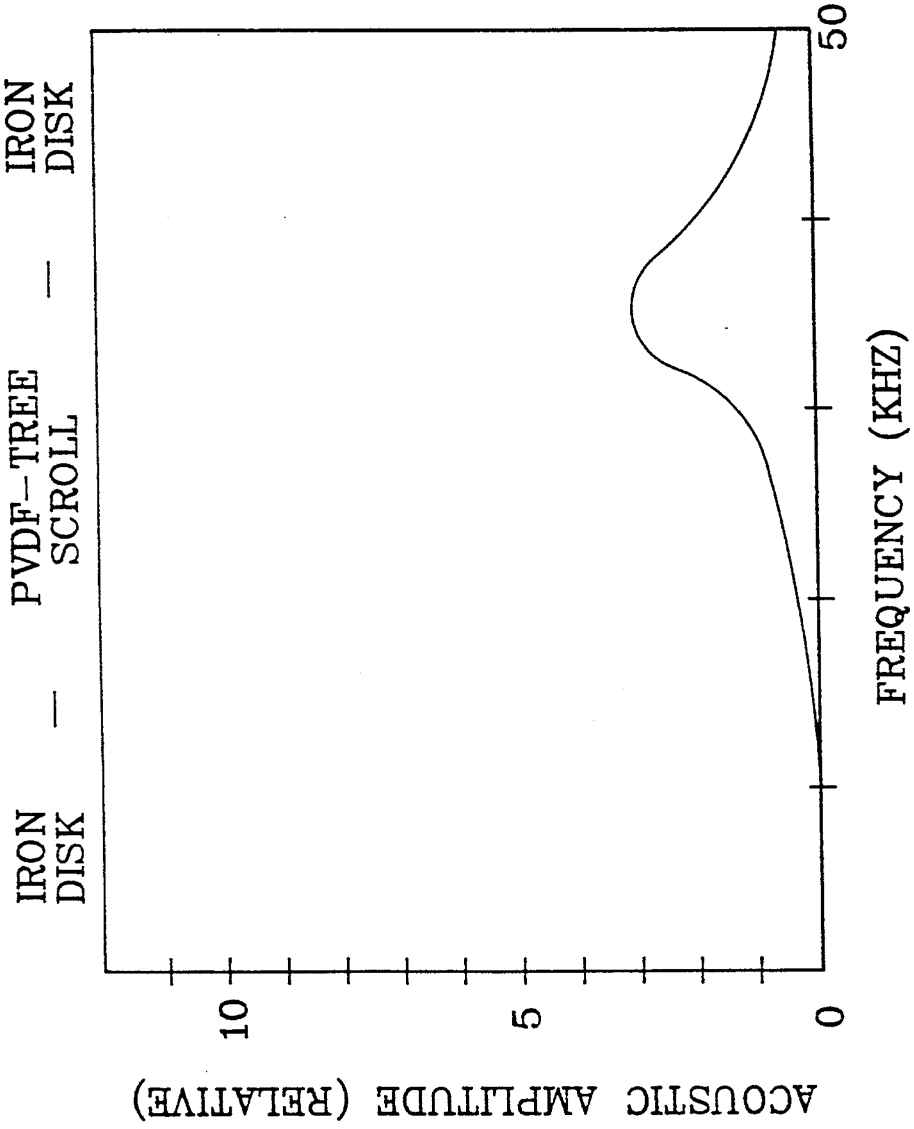
FIG. 11 shows theoretical frequency response curves for a transducer such at that shown in FIGS. 9A-B assuming a single film scroll formed of PVDF-TrFE.

FIG. 11 shows theoretical frequency response curves for the transducer of FIGS. 9A–B assuming a single film scroll formed of a copolymer of PVDF-TrFE. The radiator disk 42 and second disk 48 are again made of metal (e.g., iron), but each disk was assumed to have a diameter (D) of 2.2 cm and a thickness ($t_d$) of 2.0 mm. The length L of the scroll 40 is 7 mm. As can be seen, a greater acoustic output is achieved near the resonant frequency with this configuration than with the configuration shown in FIG. 10.

Fifth Embodiment

In accordance with a fifth embodiment, the wideband ultrasonic transducer of the present invention comprises at least two piezoelectric bimorphs spaced in proximal relation and coupled to a medium. FIG. 12 illustrates the structure of an exemplary bimorph 53 in accordance with the present invention. As shown, first and second ends 51, 55 of the bimorph 53 comprises a central member 54 which has upper and lower surfaces 54*a* and 54*b* respectively. An upper piezoelectric layer 56 is bonded to the upper surface 54*a* of the central member 54. A lower piezoelectric layer 58 is bonded to the lower surface 54*b* of the central member 54. Preferably, the central member 54 is formed of aluminum and has a thickness $t_v$ of 3.0 mm. The piezoelectric layers are preferably made of lead-zirconate-titanate (PZT), and are poled in the thickness direction. The PZT strips 56, 58 preferably each have a thickness $t_p$ of 0.3 mm, and the width w of the bimorph 53 is preferably about 5 mm. Typically, PZT has a very high mechanical Q factor, and usually the frequency response of a thickness expansion mode vibrator fabricated with PZT shows a very sharp peak resulting in a narrow bandwidth. However, the bimorph structure of the present invention, having its first and second ends 51, 55 elastically supported, has a much lower mechanical impedance and is more easily matched to lower impedance mediums, such as human tissue.

Electrode wire 60 is coupled to an electrode layer (not shown) on the outer surfaces of each piezoelectric layer, and electrode wire 62 is coupled to the central member 54 which serves as a common electrode on the bonded side of each piezoelectric layer. As known by those skilled in the art, when an electric field is applied across electrode wires 60 and 62, one of the piezoelectric layers 56, 58 will expand while the other contracts. An oscillating signal applied across electrode wires 60, 62 will therefore induce alternating expansions and contractions of the two piezoelectric layers 56, 58. As a result, the bimorph 53 is made to resonate at its resonant frequency. As shown in FIG. 12, the bimorph 53 has a length L which determines its resonant frequency. Thus, the resonant frequency of the bimorph 53 may be selected by varying its length.

FIG. 13 shows theoretical frequency response curves for a single PZT bimorph such as bimorph 53 of FIG. 12 having the preferred dimensions described above. Frequency response curves are shown for four different lengths L. As can be seen, for each length L the bandwidth is only about 4–5 kHz. According to the fifth embodiment of the present invention, therefore, at least two bimorphs 53 are employed in proximal relation as illustrated in FIG. 14. Each bimorph 53 of FIG. 14 has a different length L, and therefore, a different resonant frequency. The resonant frequencies of each bimorph 53 are selected such that the individual bandwidths of each bimorph 53 (4–5 kHz) combine to occupy a desired contiguous frequency band, which preferably has a width of 20 kHz centered at 35 kHz. The wideband transducer further comprises means for applying an oscillating electric signal to each of the piezoelectric bimorphs 53 in parallel so as to induce simultaneous vibrations of the bimorphs at their respective resonant frequencies. Thus, as shown in FIG. 14, electrode wires 60 and 62 connect each of the bimorphs 53 in parallel.

It will be appreciated by those skilled in the art that changes could be made to the embodiments described above without departing from the broad inventive concepts thereof. It is understood, therefore, that this invention is not limited to the particular embodiments disclosed, but is intended to cover all modifications which are within the scope and spirit of the invention as defined by the appended claims.

What is claimed is:

1. A wideband ultrasonic transducer comprising:

at least two stretched piezoelectric polymer films rolled together in a lengthwise direction so as to form a scroll having an axis parallel to a stretch direction of said polymer films, each of said polymer films having different widths W in a longitudinal direction of said scroll, said widths W of each polymer film being related to respective acoustic wavelengths λ of said polymer films whereby a resonant frequency of each polymer film is selected by varying said widths W of each polymer film and the respective resonant frequencies of said polymer films are selected so as to occupy a desired contiguous frequency band; and means for applying an electric field to each of said polymer films in parallel so as to induce expansion or shrinkage of said polymer films in their stretched directions, thereby causing resonance at said respective resonant frequencies of said polymer films.

2. The transducer of claim 1 wherein each of the polymer films comprises one of polyvinylidene fluoride (PVDF) and polyvinylidene fluoride-trifluoroethylene (PVDF-TrFE).

3. The transducer of claim 1 wherein said electric field applying means comprises silver ink and an elastically soft binding material applied to respective upper and lower surfaces of each of said polymer films so as to form electrodes.

4. The transducer of claim 3 wherein said silver ink and binding material are coated on said polymer films to a thickness of at least 7 microns.

5. The transducer of claim 3 wherein the elastically soft binding material is one of a polymer and an organic material.

6. The transducer of claim 1 wherein the desired contiguous frequency band of the transducer is substantially centered at 35 kHz with a bandwidth of approximately 20 kHz.

7. The transducer of claim 1 wherein said polymer films are connected end-to-end prior to rolling them together in a lengthwise direction to form said scroll.

8. The transducer of claim 3 wherein each piezoelectric polymer film comprises a double-layer film having an upper layer and a lower layer, each of said layers having said electrodes on respective surfaces thereof, said upper and lower layers being bonded to each other to form a sandwich structure such that their stretch directions are aligned and said electrodes on one surface of each layer are electrically connected, said electric field applying means applying said electric field across the thickness of each layer between said electrically connected electrodes and said electrodes on the other surface of each of said layers.

9. The transducer of claim 1 further comprising a radiator disk attached at a center portion thereof to one end of said scroll, said radiator disk being positioned normal to said one end of said scroll and having a cross-sectional area M times greater than a cross-sectional area of said one end, where M is a positive number.

10. The transducer of claim 9 wherein the radiator disk resonates in a plate flexural mode and wherein the resonant frequency of the disk is greater than the resonant frequency of the scroll.

11. The transducer of claim 9 wherein the radiator disk is further adapted to provide for acoustic matching between the transducer and a medium to which the transducer is coupled.

12. The transducer of claim 9 further comprising a second radiator disk attached at a center portion thereof to the other end of said scroll and being positioned normal to said other end of said scroll.

13. The transducer of claim 12 wherein said radiator disks are formed of a metal.

14. The transducer of claim 1 wherein the axis of said scroll is positioned parallel to the surface of a medium, and wherein the transducer further comprises a right angle acoustical reflector connected to said scroll and being operative to reflect acoustic waves radiated axially by said scroll into said medium.

15. The transducer of claim 14 wherein the acoustical reflector comprises:

a rigid housing having a high acoustical impedance and having a first end and a second end, the first end being coupled to one end of said scroll and forming a reflecting surface positioned at approximately a forty-five degree (45°) angle to the axis of said scroll; and an impedance matching member occupying the space between said one end of said scroll and said reflecting surface and being coupled to said medium for providing impedance matching between said scroll and said medium.

16. The transducer of claim 15 wherein the second end of said rigid housing is connected at the other end of said scroll, and wherein said scroll has a length substantially equal to $\lambda/4$.

17. The transducer of claim 15 wherein the second end of said rigid housing is clamped about the longitudinal midpoint of said scroll, and wherein said scroll has a length substantially equal to $\lambda/2$.

18. The transducer of claim 15 wherein the scroll is squeezed by the reflector housing into an elliptical shape.

19. The transducer of claim 15 wherein the reflector housing is formed of a metal.

20. The transducer of claim 15 wherein said medium is human tissue and said impedance matching member is formed of one of a plastic material and rubber.

21. A wideband ultrasonic transducer comprising:

at least two stretched piezoelectric polymer films rolled together in a lengthwise direction so as to form a scroll having an axis parallel to a stretch direction of said polymer films, each of said polymer films having different widths W in a longitudinal direction of said scroll, said widths W of each polymer film being related to respective acoustic wavelengths $\lambda$ of said polymer films whereby a resonant frequency of each polymer film is selected by varying said widths W of each polymer film and the respective resonant frequencies of said polymer films are selected so as to occupy a desired contiguous frequency band;

means for applying an electric field to each of said polymer films in parallel so as to induce expansion or shrinkage of said polymer films in their stretched directions, thereby causing resonance at said respective resonant frequencies of said polymer films; and a radiator disk attached at a center portion thereof to one end of said scroll, said radiator disk being positioned normal to said one end of said scroll and having a cross-sectional area M times greater than a cross-sectional area of said one end, where M is a positive number.

22. The transducer of claim 21 wherein each of the polymer films comprises one of polyvinylidene fluoride (PVDF) and polyvinylidene fluoride-trifluoroethylene (PVDF-TrFE).

23. The transducer of claim 21 wherein said electric field applying means comprises silver ink and an elastically soft binding material applied to respective surfaces of each of said polymer films so as to form electrodes.

24. The transducer of claim 23 wherein each piezoelectric polymer film comprises a double-layer film having an upper layer and a lower layer, each of said layers having said electrodes on respective surfaces thereof, said upper and lower layers being bonded to each other to form a sandwich structure such that their stretch directions are aligned and said electrodes on one surface of each layer are electrically connected, said electric field applying means applying said electric field across the thickness of each layer between said electrically connected electrodes and said electrodes on the other surface of each of said layers.

25. The transducer of claim 21 wherein the desired contiguous frequency band of the transducer is substantially centered at 35 kHz with a bandwidth of approximately 20 kHz.

26. The transducer of claim 21 wherein said radiator disk is formed of a metal.

27. A wideband ultrasonic transducer comprising:

at least two stretched piezoelectric polymer films rolled together in a lengthwise direction so as to form a scroll having an axis parallel to a stretch direction of said polymer films, each of said polymer films having different widths W in a longitudinal direction of said scroll, said widths W of each polymer film being related to respective acoustic wavelengths $\lambda$ of said polymer films whereby a resonant frequency of each polymer film is selected by varying said widths W of each polymer film and the respective resonant frequencies of said polymer films are selected so as to occupy a desired contiguous frequency band;

means for applying an electric field to each of said polymer films in parallel so as to induce expansion or shrinkage of said polymer films in their stretched directions, thereby causing resonance at said respective resonant frequencies of said polymer films;

a first radiator disk attached at a center portion thereof to a first end of said scroll, said radiator disk being positioned normal to said first end of said scroll and having a cross-sectional area M times greater than a cross-sectional area of said first end where M is a positive number, said first radiator disk for radiating acoustic waves transmitted axially from said first end of said scroll; and a second radiator disk attached at a center portion thereof to the other end of said scroll and being positioned normal to said other end of said scroll.

28. The transducer of claim 27 wherein each of the polymer films comprises one of polyvinylidene fluoride (PVDF) and polyvinylidene fluoride-trifluoroethylene (PVDF-TrFE).

29. The transducer of claim 27 wherein said electric field applying means comprises silver ink and an elastically soft binding material applied to respective surfaces of each of said polymer films so as to form electrodes.

30. The transducer of claim 29 wherein each piezoelectric polymer film comprises a double-layer film having an upper layer and a lower layer, each of said layers having said electrodes on respective surfaces thereof, said upper and lower layers being bonded to each other to form a sandwich structure such that their stretch directions are aligned and said electrodes on one surface of each layer are electrically connected, said electric field applying means applying said electric field across the thickness of each layer between said electrically connected electrodes and said electrodes on the other surface of each of said layers.

31. The transducer of claim 27 wherein the desired contiguous frequency band of the transducer is substantially centered at 35 kHz with a bandwidth of approximately 20 kHz.

32. The transducer of claim 27 wherein said first and second radiator disks are formed of a metal.

33. A wideband ultrasonic transducer for radiating ultrasonic waves into a medium comprising:

at least two stretched piezoelectric polymer films rolled together in a lengthwise direction so as to form a scroll having an axis parallel to a stretch direction of said polymer films, each of said polymer films having different widths W in a longitudinal direction of said scroll, said widths W of each polymer film being related to respective acoustic wavelengths λ of said polymer films whereby a resonant frequency of each polymer film is selected by varying said widths W of each polymer film and the respective resonant frequencies of said polymer films are selected so as to occupy a desired contiguous frequency band, said axis of said scroll being positioned parallel to a surface of said medium;

means for applying an electric field to each of said polymer films in parallel so as to induce expansion or shrinkage of said polymer films in their stretched directions, thereby causing resonance at said respective resonant frequencies of said polymer films; and a right angle acoustical reflector connected to said scroll and being operative to reflect acoustic waves radiated axially by said scroll into said medium.

34. The transducer of claim 33 wherein said electric field applying means comprises silver ink and an elastically soft binding material applied to respective surfaces of each of said polymer films so as to form electrodes.

35. The transducer of claim 33 wherein the desired contiguous frequency band of the transducer is substantially centered at 35 kHz with a bandwidth of approximately 20 kHz.

36. The transducer of claim 33 wherein the acoustical reflector comprises:

a rigid housing having a high acoustical impedance and having a first end and a second end, the first end being coupled to one end of said scroll and forming a reflecting surface positioned at approximately a forty-five degree (45°) angle to the axis of said scroll; and an impedance matching member occupying the space between said one end of said scroll and said reflecting surface and being coupled to said medium for providing impedance matching between said scroll and said medium.

37. The transducer of claim 36 wherein said medium is human tissue and said impedance matching member is formed of one of a plastic material and rubber.

38. The transducer of claim 33 wherein each of the polymer films comprises one of polyvinylidene fluoride (PVDF) and polyvinylidene fluoride-trifluoroethylene (PVDF-TrFE).

39. The transducer of claim 34 wherein each piezoelectric polymer film comprises a double-layer film having an upper layer and a lower layer, each of said layers having said electrodes on respective surfaces thereof, said upper and lower layers being bonded to each other to form a sandwich structure such that their stretch directions are aligned and said electrodes on one surface of each layer are electrically connected, said electric field applying means applying said electric field across the thickness of each layer between said electrically connected electrodes and said electrodes on the other surface of each of said layers.

40. A wideband ultrasonic transducer comprising:

a stretched piezoelectric polymer film rolled in a lengthwise direction thereof so as to form a scroll having an axis parallel to a stretch direction of said polymer film, said film being poled in a thickness direction thereof;

means for applying an electric field across the thickness of said polymer film so as to induce expansion or shrinkage of said polymer film in its stretched direction; and a radiator disk attached at a center portion thereof to one end of said scroll, said radiator disk being positioned normal to said one end of said scroll and having a cross-sectional area M times greater than a cross-sectional area of said one end, where M is a positive number.

41. The transducer of claim 40 wherein said electric field applying means comprises silver ink and an elastically soft binding material applied to respective surfaces of said polymer film so as to form electrodes.

42. The transducer of claim 40 wherein each of the polymer films comprises one of polyvinylidene fluoride (PVDF) and polyvinylidene fluoride-trifluoroethylene (PVDF-TrFE).

43. The transducer of claim 41 wherein said piezoelectric polymer film comprises a double-layer film having an upper layer and a lower layer, each of said layers having said electrodes on respective upper and lower surfaces thereof, said upper and lower layers being bonded to each other to form a sandwich structure such that said electrodes on one surface of each layer are electrically connected, said electric field applying means applying said electric field across the thickness of each layer between said electrically connected electrodes and said electrodes on the other surface of each of said layers, the stretch directions of said upper and lower surfaces being aligned.

44. The transducer of claim 40 wherein the desired contiguous frequency band of the transducer is substantially centered at 35 kHz with a bandwidth of approximately 20 kHz.

45. The transducer of claim 40 wherein said radiator disk is formed of a metal.

46. A wideband ultrasonic transducer comprising:

a stretched piezoelectric polymer film rolled in a lengthwise direction thereof so as to form a scroll having an axis parallel to a stretch direction of said polymer film, said film being poled in a thickness direction thereof;

means for applying an electric field across the thickness of said polymer film so as to induce expansion or shrinkage of said polymer film in its stretched direction;

a first radiator disk attached at a center portion thereof to a first end of said scroll, said radiator disk being positioned normal to said first end of said scroll and having a cross-sectional area M times greater than a cross-sectional area of said first end where M is a positive number, said first radiator disk for radiating acoustic waves transmitted axially from said first end of said scroll; and a second radiator disk attached at a center portion thereof to the other end of said scroll and being positioned normal to said other end of said scroll.

47. The transducer of claim 46 wherein said electric field applying means comprises silver ink and an elastically soft binding material applied to respective surfaces of said polymer film so as to form electrodes.

48. The transducer of claim 46 wherein each of the polymer films comprises one of polyvinylidene fluoride (PVDF) and polyvinylidene fluoride-trifluoroethylene (PVDF-TrFE).

49. The transducer of claim 47 wherein said piezoelectric polymer film comprises a double-layer film having an upper layer and a lower layer, each of said layers having said electrodes on respective upper and lower surfaces thereof, said upper and lower layers being bonded to each other to form a sandwich structure such that said electrodes on one surface of each layer are electrically connected, said electric field applying means applying said electric field across the thickness of each layer between said electrically connected electrodes and said electrodes on the other surface of each of said layers, the stretch directions of said upper and lower surface being aligned.

50. The transducer of claim 46 wherein the desired contiguous frequency band of the transducer is substantially centered at 35 kHz with a bandwidth of approximately 20 kHz.

51. The transducer of claim 46 wherein said first and second radiator disks are formed of a metal.

* * * * *